United States Patent [19]
Chu et al.

[11] Patent Number: 5,422,643
[45] Date of Patent: Jun. 6, 1995

[54] HIGH DYNAMIC RANGE DIGITIZER

[75] Inventors: Ching Chu; Steven Prowse, both of Oakville; John Haywood, Burlington, all of Canada

[73] Assignee: Antel Optronics Inc., Burlington, Canada

[21] Appl. No.: 21,435

[22] Filed: Feb. 24, 1993

[51] Int. Cl.⁶ ............................................. H03M 1/18
[52] U.S. Cl. .................................... 341/141; 341/139
[58] Field of Search ............... 341/141, 138, 139, 120, 341/155, 137

[56] References Cited

U.S. PATENT DOCUMENTS

| | | | |
|---|---|---|---|
| 4,364,027 | 12/1982 | Murooka | 341/141 X |
| 4,449,120 | 5/1984 | Rialan et al. | 341/141 X |
| 4,926,175 | 5/1990 | Ishizawa et al. | 341/141 |
| 4,933,676 | 6/1990 | Hauge et al. | 341/141 |
| 5,111,203 | 5/1992 | Calkins | 341/141 |
| 5,124,707 | 6/1992 | Stove | 341/141 X |

*Primary Examiner*—Brian K. Young
*Attorney, Agent, or Firm*—Bereskin & Parr

[57] ABSTRACT

A digitizer suitable for digitizing input signals having a high dynamic range. The digitizer is microprocessor controlled and comprises an input stage, a multi-channel attenuator or amplifier bank, a multiplexer and a analog-to-digital (A/D) converter. The function of the multi-channel bank is to move the input signal within the range of the A/D converter. The input signal to be digitized is fed through the input stage to each of the channels in the attenuator bank. The signal is scaled by each respective channel in the attenuator bank. The multiplexer is used to switch the scaled signal which is within the range of the A/D converter for digitizing. The digitized sample is then corrected according to the attenuation or gain factor of the scaled channel. The digitizer includes a comparator bank which is used to determine the channel with the widest signal range within the range of the A/D converter. The digitizer also includes a channel calibrator for calibrating the actual gain or attenuation of each channel. In another aspect, the digitizer can be implemented using an optical front-end comprising an optical beam splitter, optical attenuators and amplifier banks. The optical front-end provides improved noise immunity and faster speed of operation.

13 Claims, 5 Drawing Sheets

HIGH DYNAMIC RANGE DIGITIZER

FIELD OF THE INVENTION

The present invention provides a high dynamic range digitizer. More particularly, the present invention provides a multiple-channel analog-to-digital converter and method which is suitable for digitizing signals that have a high dynamic range such as signals in Optical Time Domain Reflectometer systems.

BACKGROUND OF THE INVENTION

The optical time domain reflectometer (OTDR) is an instrument which is used for measuring the attenuation and other characteristics of a fiber optic cable. The OTDR sends light pulses down an optical fiber and measures the reflected and backscattered light. The principal advantages of the OTDR method are that the fiber cable does not have to be cut nor do both ends of the fiber cable have to be accessed.

The fiber characteristics and features along the cable will cause portions of the light pulse to be backscattered and reflected back to the OTDR. The OTDR has a receiver stage which includes a photodetector. The photodetector detects the backscattered and reflected light and converts it into electrical signals. The OTDR can include a boxcar integrator circuit which integrates the electrical signals for improving the signal-to-noise ratio (SNR). The boxcar circuit can also include an amplifier stage. The OTDR uses the signals from the boxcar integrator to generate a waveform which shows the characteristics and features of the fiber as a function of time, but displays it on a monitor as a function of distance along the length of the fiber cable.

The waveform produced by an OTDR typically has three types of features. The first feature comprises an initial pulse, which results from reflection of the input light pulse at the OTDR-fiber optic connection. The second feature of the waveform is an exponentially decaying plot which corresponds to the Rayleigh backscattering that occurs as the light pulse propagates down the length of the fiber cable. Rayleigh backscattering is caused by imperfections in the fiber such as impurities, air bubbles, or moisture. The third feature comprises discrete pulses or peaks which are the result of Fresnel reflection. Fresnel reflection typically occurs at connection points because of the glass-air-glass interface. Fresnel reflection can also result from physical breaks in the fiber.

The level of the reflected light resulting from Fresnel reflection can be up to 4% of the initial light pulse which is injected by the OTDR into the fiber cable. The Rayleigh backscattered light, on the other hand, produces a very low level signal. The level of the Rayleigh backscattered light is inversely proportional to the wavelength of the light pulse raised to the fourth power. For example, as the wavelength of the input light pulse is increased from 850 nanometers (nm) to 1550 nm, the signal level due to backscatter decreases dramatically. Therefore, to accurately reproduce the fiber optic cable features, the OTDR must have the capability to detect and process signals over a large dynamic range. The dynamic range of signals typically processed by an OTDR can be 60 decibels (dB) in terms of optical power.

There are problems in digitizing a signal having such a high dynamic range. First, the range of signal levels over a high dynamic range signal can saturate the analog-to-digital converter and/or the amplifier in the receiver stage of the OTDR. Known OTDRs typically amplify the signal prior to analog-to-digital conversion in order to improve the signal to noise ratio (S/N). Secondly, to cover the typical signal range of an OTDR, i.e. 60 dB, the analog-to-digital converter must have a resolution of at least 1,000,000 steps. Known 20-bit A/D converters can have a 1,048,576 step resolution; but, 20 bit A/D converters are costly. In addition, the conversion time for a 20-bit A/D is usually too long for effective data acquisition as required in real time applications such as an OTDR system.

BRIEF SUMMARY OF THE PRESENT INVENTION

Accordingly, the present invention provides a multi-channel analog-to-digital converter and method which is capable of converting an input signal having a high dynamic range into a digital signal. The present invention provides a cost effective implementation for analog-to-digital conversion which is suitable for real time data acquisition systems such as an OTDR.

In a first aspect, the present provides a digitizer for digitizing an input signal with a large dynamic range, said digitizer comprising: (a) an input port for receiving the input signal; (b) a scaling bank for scaling the input signal, said scaling bank being coupled to the input port, and having a plurality of channels and each channel including an output and scaling means for producing at said output a scaled signal corresponding to the input signal; (c) a switch coupled to the outputs of said scaling bank and having a switch output and switching means for producing at the switch output one of said scaled signals; (d) an analog-to-digital converter having an analog input coupled to said switch output for receiving said scaled signal, and including a data output port and digitizing means for converting said scaled signal into a digital signal for output at said data output port; and (e) controller means coupled to switch for controlling said switching means.

In a second aspect the present invention provides a method for using an analog-to-digital converter having a fixed resolution to digitize an input signal with a dynamic range that is outside the fixed resolution of said converter, said method comprising the steps of: (a) scaling the input signal according to a scaling factor to move the input signal within the resolution of the converter; (b) digitizing the input signal through the converter to produce a data sample; and (c) correcting the data sample by applying the scaling factor from step (b).

BRIEF DESCRIPTION OF THE DRAWINGS

For a better understanding of the present invention, and to show more clearly how it may be carried into effect, reference will now be made, by way of example, to the accompanying drawings in which.

DETAILED DESCRIPTION OF THE PREFERRED EMBODIMENTS

Figure 1:
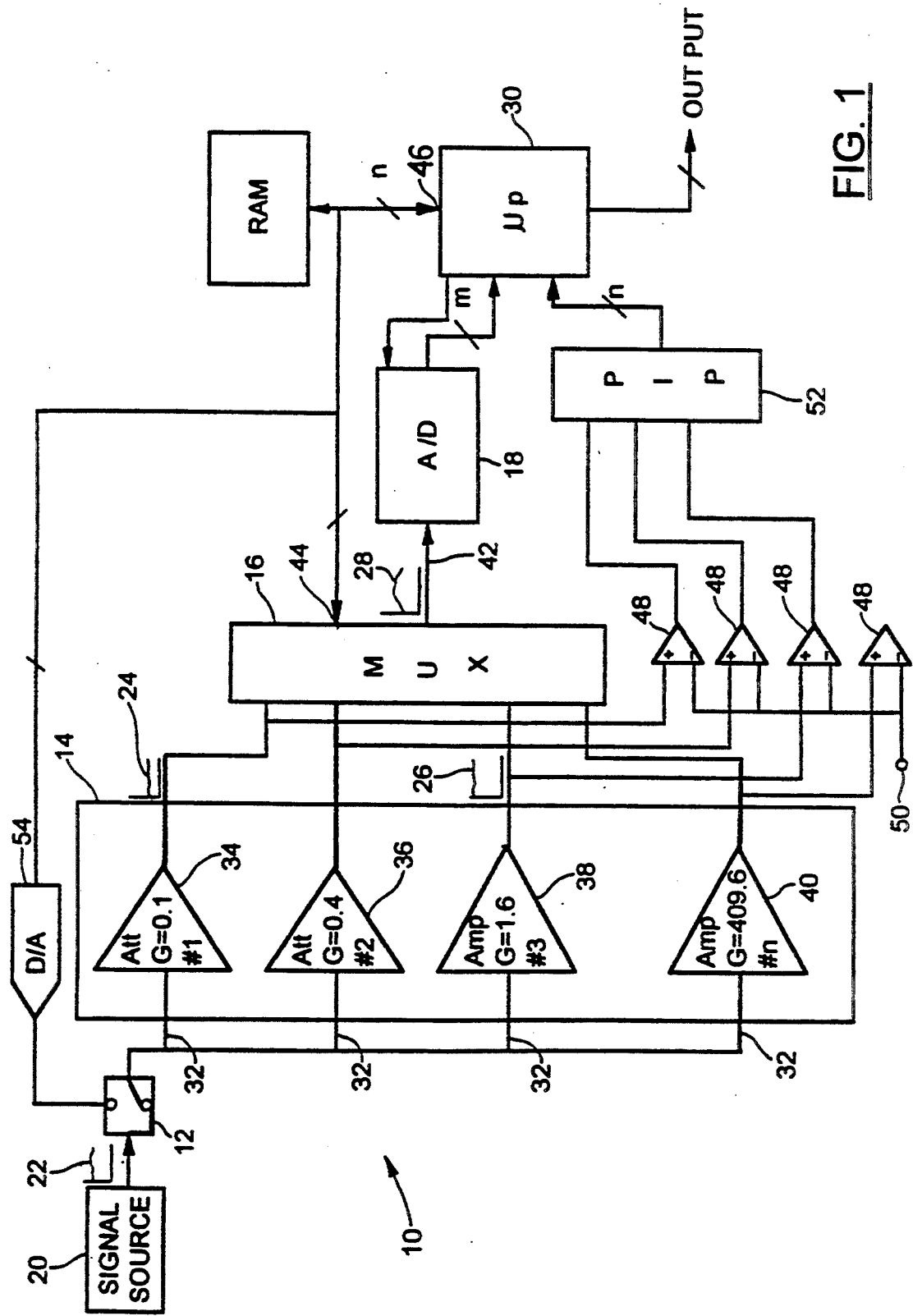
FIG. 1 shows in block diagram form a preferred embodiment of a digitizer according to the present invention.

FIG. 1 shows in block diagram form a high dynamic range digitizer, indicated by reference 10, according to the present invention. The digitizer 10 comprises an input port 12, a scaling bank 14, an analog multiplexer 16, and a analog-to-digital (A/D) converter 18. The input port 12 couples the digitizer 10 to a signal source 20 which provides an analog signal 22 for conversion by the digitizer 10.

A feature of the digitizer 10 according to the present invention is its ability to extend the dynamic range of an analog-to-digital converter 18 having a fixed precision. For example, a 10-bit analog-to-digital converter has 1024 steps which provides a dynamic range of 60 dB. The digitizer 10 according to the present invention can utilize such a 10-bit A/D converter over a dynamic range of 120 dB, thereby providing a cost effective digitizer for real time data acquisition applications such as an OTDR system.

The digitizer 10 extends the dynamic range by bringing the level of the analog signal 22 within the range or resolution of the A/D converter 18. In other words, the precision of analog conversion only needs to be resolved to the resolution of the A/D converter 18. As will be discussed in detail, this is accomplished by attenuating or amplifying the analog signal 22 so that it falls with the range of the A/D converter 18.

For example, if the level of the analog signal 22 is above the range of the A/D converter 18, then the scaling bank 14 will attenuate the signal 22 to produce an attenuated analog signal (indicated by reference 24 in FIG. 1 ) which is within the range of the A/D converter 18. If on the other hand the signal 22 is very weak, the scaling bank 16 will amplify the signal 22 to produce an amplified analog signal (indicated by reference 26 in FIG. 1) which provides greater resolution. The A/D converter 18 then digitizes the attenuated (or amplified) signal 22 into a digital sample. This sample will not however be accurate because it corresponds to the value of the attenuated analog signal, not the original signal. Therefore, the digitized sample is expanded by the factor of the attenuation to compensate for the compression or attenuation of the original analog signal.

As shown in FIG. 1, the output of the A/D convertor is coupled to a microprocessor 30. The microprocessor 30 controls the operation of the digitizer 10. The microprocessor can also be used to process the digital output of the A/D converter or to calibrate the scaling bank. In the following discussion, the structure of the digitizer 10 is described with reference to discrete integrated circuits. It will be appreciated by those skilled in the art that the digitizer 10 can also be implemented using fewer integrated circuits if a commercially available microcontroller with on-chip resources such as an A/D converter and multiplexer is used. Such a cost and space effective implementation will be discussed in reference to FIG. 2 below.

The digitizer 10 shown in FIG. 1 is coupled to a signal source (indicated by reference 32) by the input port 12. In an OTDR system, the signal source typically comprises a photodetector (not shown). The photodetector converts the reflected light pulses from the fiber cable into electrical signals which are processed by a boxcar integrator (not shown) into the analog voltage signal 22.

The input port 12 feeds the analog signal 22 into the scaling bank 14. The function of the scaling bank 14 is to move the analog signal into the range of the A/D converter 18. The scaling bank 14 consists of N channels 32 where each channel 32 provides a different gain factor or attenuation coefficient. In FIG. 1, the scaling bank 14 includes an attenuator 34 having a coefficient of 0.1 (to produce the attenuated signal 24), an attenuator 36 having a coefficient of 0.4, an amplifier 38 having with a gain of 1.6 (to produce the amplified analog signal 26), all the way up to an amplifier 40 with a gain of 404.6. The amplifiers and attenuators can be implemented using operational amplifiers and conventional analog design techniques.

The number of channels 32 in the scaling bank 14 will depend on the dynamic range of the analog signal 22 and the precision of the A/D converter 18. The gain or attenuation factors of each channel 34 should also be selected such that there is some overlap of the scaled analog signals 24 or 26 across the range or resolution of the A/D converter 18. For example, an overlap range of 6 to 8 bits has been found to provide sufficient resolution for quantization and calibration purposes.

The output of each attenuator 34,36 and amplifier 38,40 provides an input to the analog multiplexer 16. The function of the multiplexer 16 is to select the scaled analog signal 24 or 26 which is within the range of the A/D converter 18. The multiplexer 16 has an output 42 and input select lines 44. The output 42 of the multiplexer 16 is connected to the analog input on the A/D converter 18 and the input select lines 44 are connected to a input/output (I/O) port 46 on the microprocessor 30.

Under the control of the microprocessor 30, the multiplexer 16 selects and routes one of the scaled analog signals 24 or 26 to the input of the A/D converter 18. By selecting the scaled analog signal 24 or 26 which is within the range of the A/D converter 18, the scaled analog signal 24 or 26 can be converted into a digital sample which utilizes the full precision, e.g. 10 bits, of the A/D converter 18 without saturating the converter 18. The A/D converter 18 converts the scaled analog signal 24 or 26 into a digital sample.

The digital sample must be corrected in order to yield its true value. The correction is necessary because scaling bank 14 changed the amplitude of the input analog signal 22. If, for example, the input analog signal 22 was beyond the range of the converter 18, then the scaled analog signal 26 corresponds to the input signal 22 which has been attenuated by attenuator 36. Because the A/D converter 18 digitized the scaled value, i.e. analog signal 26, of the input analog signal 22, the digital sample must expanded by a factor which is equal to the attenuation factor of the attenuator 36 in the scaling bank 14. Similarly, if the input analog signal 22 was amplified (i.e. scaled analog signal 26) to move it within the range of the A/D converter 18, then the resulting digital sample must be compressed to account for the gain of the amplifier 38 in the scaling bank 14. These operations are well within the capability of one skilled in digital signal processing. The digital sample is then available for further processing by the microprocessor 30 or a main processor (not shown) in the OTDR.

An important aspect of the present invention involves selecting a channel 32 for which the scaled analog signal 24 or 26 is close to the full range of the A/D converter 18. By selecting the widest channel, a digital sample with good resolution can be obtained.

There are two ways in which the microprocessor 30 can determine the channel 32 of the scaling bank 14 to select for digitizing by the A/D converter 18. The first technique entails digitizing the output of a channel 32 and looking at the most significant bit of the digital sample to determine if the scaled analog signal has saturated the A/D converter 18. For example, if the 1.6 gain channel 38 is digitized first, then a digital sample having a most significant bit (msb) equal to logic one will indicate that the scaled analog signal 26 is in the upper half of the range of the A/D converter 18 and therefore, an attenuated channel 34 or 36 must be selected for digitizing. On the other hand, if the most significant bit is logic zero, then the scaled analog signal 26 is in the lower half of the range of the converter 18, and the higher channel should be digitized to determine if the analog 26 is highest signal within the range of the converter 18. While this technique offers the advantage that it can be programmed into firmware with little additional hardware, it may be unnecessarily slow for a system having many channels or high speed data acquisition requirements.

The second technique for selecting the channel 32 for digitizing is combination of firmware and hardware. The inclusion of hardware speeds up the conversion process according to this technique. Referring to FIG. 1, the digitizer 10 includes a bank of comparators 48. The microprocessor 30 uses the comparators 48 to determine which channel 32 in the scaling bank 14 is close to the full range of the A/D converter 18, i.e. the channel 32 that will not saturate the A/D converter 18. Once the first non-saturated channel 32 is found, the microprocessor 30 uses the multiplexer 16 to switch that channel 32 to the A/D converter 18. The bank of comparators 48 provide the microprocessor 30 with an analog "look ahead" or "pre-scaling" function which speeds up the conversion process of the digitizer 10.

If there are N channels 32 in the scaling bank 14, then N-1 comparators 48 are needed to determine which channel 32 is close to the full range of the A/D converter 18. Referring to FIG. 1, the non-inverting input of each comparator 48 is connected to one of the channels 32 and the inverting input of each comparator 48 is connected to a common reference voltage 50. In the preferred embodiment of the present invention, the reference voltage 50 is set to 95% of the full scale resolution of the A/D converter 18.

The outputs of the comparators 48 are input to the microprocessor 30 via a parallel input port. 52 For the scaled analog signals which are below the range of converter 18, i.e. the common reference, the respective comparators 48 will produce a logic low output, while the scaled analog signals which are above the range of the converter 18 will result in logic high outputs on the respective comparators 48. Therefore to determine the channel 32 which occupies the widest range of the A/D converter 18 without saturating, the microprocessor 30 (firmware) need only look for a logic zero followed by logic ones, thereby eliminating the time intensive process of repetitive A/D conversions on channels containing little or no useful information.

For the digitizer 10 shown in FIG. 1, the microprocessor 30, the A/D converter 18, the analog multiplexer 16, and the parallel interface port 52 can be combined in a single unit 54 or package (shown in broken outline) using a processor such as the 80C196 microcomputer chip which manufactured by Intel Corporation Inc. A single package implementation provides the advantage of a small footprint and lower cost, without sacrificing speed or processing power. Suitable commercially available components for the amplifiers 38,40 and attenuators 34,36 include the LF412 operational amplifier which is manufactured by National Semiconductor Corporation.

In theory, the scaling bank 14 could have a very large number of channels 32 to move the different levels of the input analog signal 22 within the range of the fixed precision A/D converter 18. In practical systems, however, only a finite number of channels 32 are necessary to keep the input analog signal 22 within the precision of the A/D converter 18.

Figure 2:
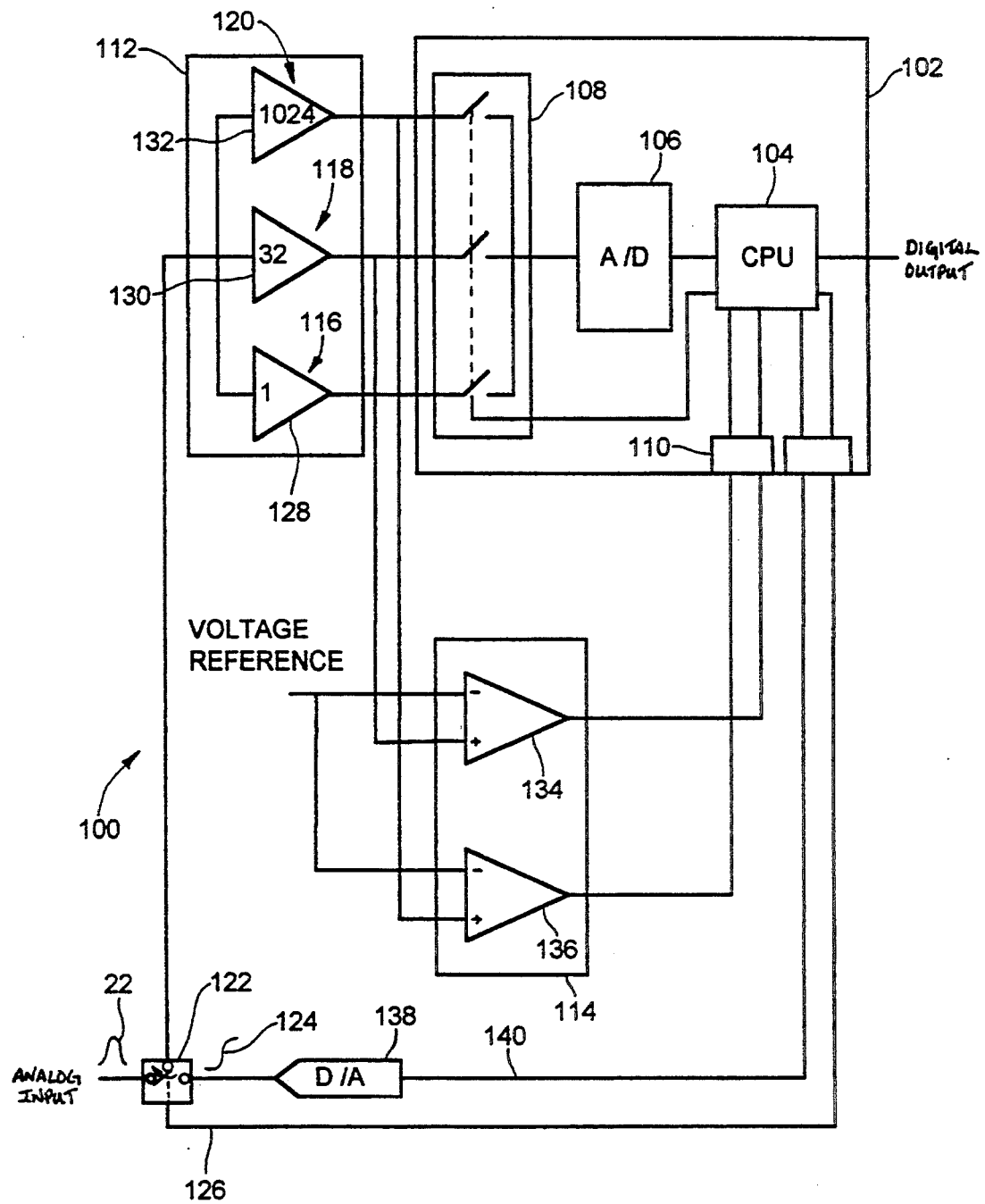
FIG. 2 shows in block diagram a three channel implementation of the digitizer in FIG. 1.

In a typical OTDR system, the input analog signal 22 may have a dynamic range of 120 dB. FIG. 2 shows a practical implementation of the digitizer 10 (of FIG. 1) which is suitable for a 120 dB dynamic range in an OTDR system.

Referring to FIG. 2, the OTDR digitizer indicated by reference 100 utilizes a single chip microcomputer 102 such as the 80C196 manufactured by Intel Corporation. The microcomputer 102 includes a microprocessor or cpu 104 and, on-chip resources, such as a 10-bit A/D converter 106, an analog multiplexer 108 and a parallel input port 110. The operation of the A/D converter 106 and multiplexer 108 are controlled by the cpu 104 through firmware according to the manufacturer's specifications.

The digitizer 100 also includes a scaling bank 112 and a comparator bank 114. The scaling bank 112 couples to the inputs of the analog multiplexer 108 and comprises a unity gain channel 116, a 32 attenuation factor channel 118 and a 1024 attenuation factor channel 120. Each of the channels 116,118,120 can implemented the LF412 operational amplifier manufactured by National Semiconductor Corporation and conventional analog design techniques. The input of the scaling bank 112 is coupled to an input source switch 122.

The input source switch 122 selects between the input analog signal 22 from the boxcar integrator (not shown) and a test signal input 124 (the function of the test signal 124 will be explained below). The microprocessor 104 controls switch 122 through an output line 126.

The first channel 116 comprises an operational amplifier (1-opamp) 128 having a unity gain. The unity gain opamp 128 provides a buffer function. The second channel 118 comprises an operational amplifier 130 with an attenuation factor of 32 (denoted as 32-opamp); and the third channel 120 comprises an operational amplifier 132 having an attenuation factor of 1024 (denoted as 1024-opamp).

The 10-bit resolution of the on-chip A/D converter 106 provides the 60 dB of dynamic range, and the second and third channels 118,120 prevent saturation of the converter 106 by attenuating the input analog signal 22 when it exceeds the 10-bit range. In other words, the attenuation of the second channel 118 (factor of 32) increases the dynamic range of the converter 106 by 30 dB and the attenuation of the third channel 120 (factor of 1024) increases the dynamic range by a further 30 dB.

The comparator bank 114 performs the "look-ahead" for determining which channel 116, 118 or 120 is within the range of the converter 106 without saturating. The comparator bank 114 comprises two comparators 134, 136, (i.e. N−1=3−1). The non-inverting input of the first comparator 134 is connected to the output of the second channel 118 (i.e. 32-opamp) and the non-inverting input of the second comparator 136 is connected to the output of the third channel 120 (i.e. 1024-opamp.) The inverting input of each comparator 134,136 is connected to a common voltage reference 138. The voltage reference 138 is selected to be 5% below the saturation level of the A/D converter 106.

An algorithm, (channel select algorithm") for selecting the channel 116,118 or 120 within the widest range of the converter 106 is shown below in Chart 1. The algorithm can be coded in the firmware of the microprocessor 104. For ease of reference the algorithm is illustrated using "pseudocode" format.

---
Chart 1
Channel Select Algorithm
---

```
void storeDataSample (void)
{
    switch (ComparatorResults())
    {
        case LOW:
            startADconversion (LOW);
            data = readADresult ();
            data = data * scale_low + offset_low;
            break;
        case MEDIUM:
            startADconversion (MEDIUM);
            data = readADresult ();
            data = data * scale_med + offset_med;
            break;
        case HIGH:
            startADconversion (HIGH);
            data = readADresult ();
            data = data * scale_high + offset_high;
            break;
    }
    *(memory_location++) = data;
}
```

Referring to Chart 1 above, the channel select algorithm selects the channel (116, 118 or 120) and performs the analog-to-digital conversion based on the return value of "ComparatorResults()". The function ComparatorResults() determines which channel covers the widest range of the A/D converter, and returns either LOW (channel 116 or 1-opamp), MEDIUM (32-opamp or channel 118) or HIGH (1024-opamp or channel 120). The output on the selected channel 116,118 or 120 (i.e. attenuated value of the analog signal 22) is routed to the A/D converter 106 by a call to function "startADconversion()" which controls the analog multiplexer 108. The scaled analog signal on the selected channel is digitized by the A/D converter 106 in response to function call "readADresult()". The digital sample ("data") is then scaled according to the attenuation coefficient of the the channel and corrected for the offset of operational amplifier. The calibration of the offset is discussed in the following paragraphs.

It will be appreciated by those skilled in the art that no two operational amplifiers will have identical gains and input offset characteristics. In addition, there will be other variations in the hardware such as resistor tolerances, temperature coefficients, and offsets in the switches of the analog multiplexer which will also tend to affect the attenuation coefficients (and gain factors) of the channels in the scaling bank. Consequently, to provide accurate analog-to-digital conversion, the correction of the digital sample must take into account the actual gain and offset introduced by the operational amplifiers 128,130,132 in the respective channels 116,118,120 of the scaling bank 112. For example, even though the second channel 118 is designed to provide an attenuation coefficient of 32, due to component tolerances the actual attenuation produced by the operation amplifier 130 can be 31.996 with an offset of 0.035 added to the input analog signal 22. If the firmware uses a factor of 32 to expand the digital sample, then the adjusted value of the digital sample would be incorrect. In effect, there would be a non-linear transfer function from input analog signal to adjusted output digital sample.

To provide the capability to calibrate the channels 116,118,120 of the scaling bank 112, the digitizer 100 shown in FIG. 2 includes a channel calibrator which comprises a digital-to-analog converter 138 (indicated by reference 54 in FIG. 1 ). The digital input of the D/A converter 138 is connected to an output port 140 on the microprocessor 104. The analog output of the D/A converter 138 provides the other input to the switch 122. The function of the D/A converter 138 is to provide the microprocessor 104 with a means of injecting test signals 124 into the scaling bank 112 in order to calibrate the gain and offset characteristics (i.e. "scale_" and "offset_" in Chart 1) of the operational amplifier 128,130,132 in each channel. The channel calibrator is a combination of firmware and the hardware (D/A converter 138) shown in FIG. 2.

The D/A converter converts a digital data sample received from the microprocessor 106 into the analog test signal 124. The microprocessor 106 interface to the channel calibrator allows a wide range of test signals 124 to be passed through the channels 116,118,120 of the scaling bank 112 under the control of firmware. The firmware can run the digitizer in a "calibration mode" simply by switching the input switch 122 to the D/A converter 138.

Figure 3:
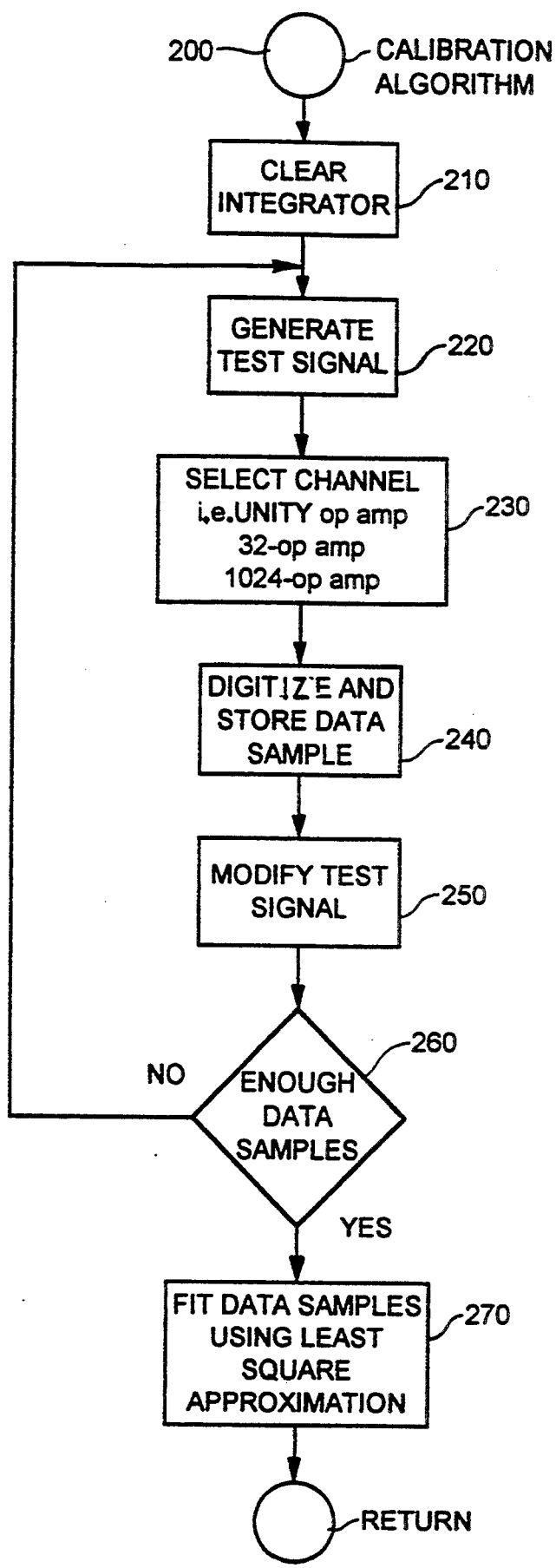
FIG. 3 shows in flow chart form a method according to the present invention for calibrating the gain and offset of the channels of the digitizer shown in FIG. 2.

In calibration mode, the microprocessor runs a calibration algorithm 200 which is shown as a flow chart in FIG. 3.

To calibrate each channel 116,118,120 of the scaling bank 112, the calibration algorithm 200 uses an analog integrator (not shown) which is included in the hardware of the microcomputer 102. The integrator (not shown) converts a step function into a ramp test signal. The ramp test signal provides a known and controllable test signal 124 against which digital samples from the channels 116,118,120 of the scaling bank 112 can be processed by the microprocessor 104.

The digital samples produced by the A/D converter 106 in response to the (ramp) test signal 124 are read in by the microprocessor 104. The algorithm 200 generates a linear transfer function by using another algorithm based on the Minimum Least Squared (MLSR) method to fit the digital samples and produce a linear transfer function for the channels 116,118,120. The linear transfer function allows a digitized sample from one channel 118 to be corrected so that there is correlation between the other channels 116,120 of the scaling bank 112. The digital samples can then be correctly expanded to their full scale values according to the scale and offset characteristics of the each channel.

The calibration algorithm 200 is based on the premise that the weakest analog input signal 22 will use the channel (operational amplifier) with the least attenuation, i.e. the first channel 116 or unity gain opamp. The algorithm 200 uses the first channel 116 as the reference against which to measure the attenuation coefficients and offsets introduced by the operational amplifiers 130,132 in the other two channels 118,120 in order to build a transfer function for the scaling bank 112.

The calibration algorithm will now be explained in detail with reference to FIG. 3 and the corresponding pseudocode shown in Chart 2 where appropriate.

```
                        Chart 2
              Channel Calibration Algorithm
void ScaleOpamps (void)                                 (1)
{
    int samples = 0;
    float scale_med = 0;
    float offset_med = 0;
    float scale_high = 0;
    float offset_high = 0;

createTestSignal (LOW);                             (2)
    while (samples < 30)                                (3)
    {
        startADconversion (LOW);                        (4)
        table [counter].x = readADresult ();            (5)
        startADconversion (MEDIUM);                     (6)
        table [counter].y = readADresult ();            (7)
        modifyTestSignal ();                            (8)
    } performLSACurveFit                                  (9)
    (table,&scale_med, &offset_med);

createTestSignal (MEDIUM);                         (10)
    while (samples < 30)                               (11)
    {
        startADconversion (MEDIUM);                    (12)
        table [counter].x = readADresult ();           (13)
        startADconversion (HIGH);                      (14)
        table [counter].y = readADresult ();           (15)
        modifyTestSignal ();                           (16)
    }
    performLSACurveFit                                 (17)
    (table,&scale_high, &offset_high);
}
```

The first step in the calibration algorithm 200 is to clear the integrator indicated by block 210. The next step involves generating a test signal 124 (Chart 2—line 2). The calibration algorithm injects the test signal into the first two channels 116,118 (1-opamp and 32-opamp) simultaneously in block 220. The algorithm then selects the 1-opamp 128 or first channel 116 in block 230 (Chart 2-line 4). The output of the 1-opamp 128 is then digitized and stored in data sample table in memory, in block 240 (Chart 2-line 5). The selection, digitization and memory save steps are repeated for the 32-opamp 130 or second channel 118 (Chart 2—lines 6-7). The test signal 124 is then modified by the algorithm in block 250 (Chart 2—line 8). The algorithm repeats the steps in blocks 220 to 250 until enough samples have been obtained block 260 (Chart 2—line 3). Typically 30 to 50 samples are necessary to generate the linear transfer function.

Once the 30 samples have been obtained for both channels 116,118, the algorithm calls a function which uses the Least Squares Approximation technique to fit the samples to a curve, as indicated in block 270 (Chart 2—line 9). The function computes the scale and offset factors between the 32-opamp 130 and the baseline 1-opamp, i.e. "scale_med" and "offset_med" respectively (Chart 2—line 9). The scale and offset factors are used by the conversion algorithm in Chart 1 above.

Because the entire range of the 1024-opamp is equal to one step (i.e. one bit) on the 10-bit A/D converter 106, the third channel 120 cannot be calibrated with any precision, and therefore the 1024-opamp must be calibrated indirectly. The 1024-opamp is calibrated against the 32-opamp (second channel 118) by repeating the steps in blocks 210 to 270 (Chart 2—lines 10-17). The results of this calibration are then fed through the first calibration (i.e. the calibration of the 32-opamp against the baseline opamp) so that the 1024-opamp is correctly scaled according to the baseline opamp as given by the following expressions:

$$output_1(x) = scale_{32,1} * X + offset_{32,1} \quad (1)$$

$$output_1(X) = scale_{32,1} * (scale_{1024,32}) + offset_{32,1} \quad (2)$$

In this way, the 1024-opamp 132 is accurately calibrated against the baseline opamp 128 indirectly through the 32-opamp 130.

Figure 4:
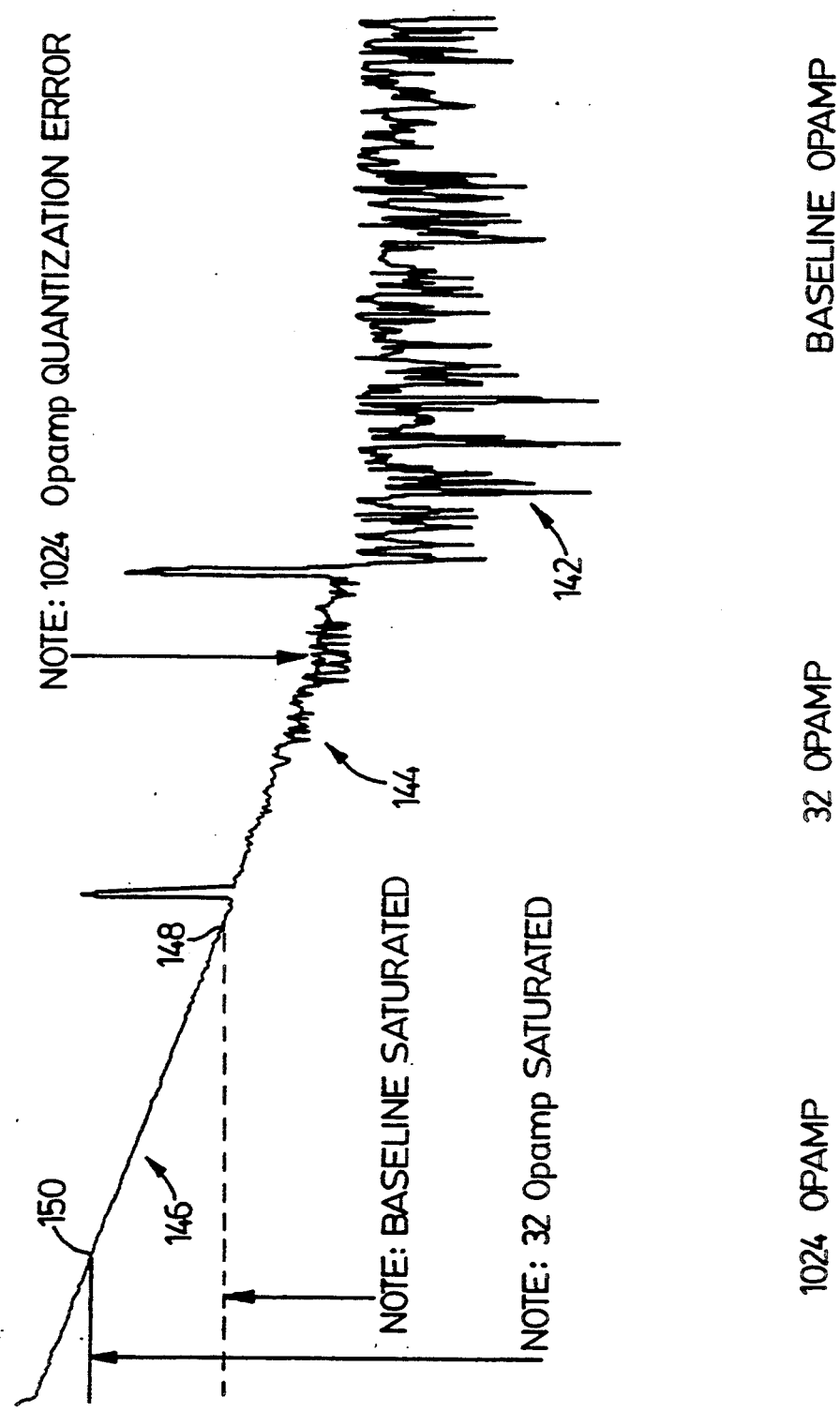
FIG. 4 shows the saturation for the respective channels over the dynamic range of the input signal for the digitizer in FIG. 2.

Reference is next made to FIG. 4 shows the respective saturation of the first and second channels 116,118 across the dynamic range of the input analog signal 22. The input signal is depicted as a waveform which is divided into first, second and third segments 142,144, and 146.

The first segment 142 corresponds to the operation of the first channel 116 or baseline opamp 128. As can be seen, the microprocessor 104 use the output of the first channel 116 for digitizing until the analog signal 22 saturates the baseline opamp 128, which is indicated at point 148 in FIG. 4.

The second segment 144 corresponds to the operation of the second channel 118 or 32-opamp 130. Since the second channel 118 attenuates the analog signal 22, the 32-opamp 130 has a wider range than the baseline opamp 128 (at the expense of absolute resolution over the range of the A/D converter 106). If analog signal 22 is beyond the range of the first channel 116 (i.e. baseline opamp 128 saturated at point 148), the microprocessor 104 selects and digitizes the output from the second channel 118 or 32-opamp 130. Similarly, if the analog signal 22 is beyond the range of the second channel 118 (i.e. the 32-opamp 130 is saturated, point 150), then the microprocessor selects and digitizes the output of the third channel 120 or 1024-opamp 132. By matching the attenuation coefficients of the channels 116,118,120 to the dynamic range of the analog signal 22, the analog signal 22 can be sampled over its entire range without saturating the digitizer 100.

Figure 5:
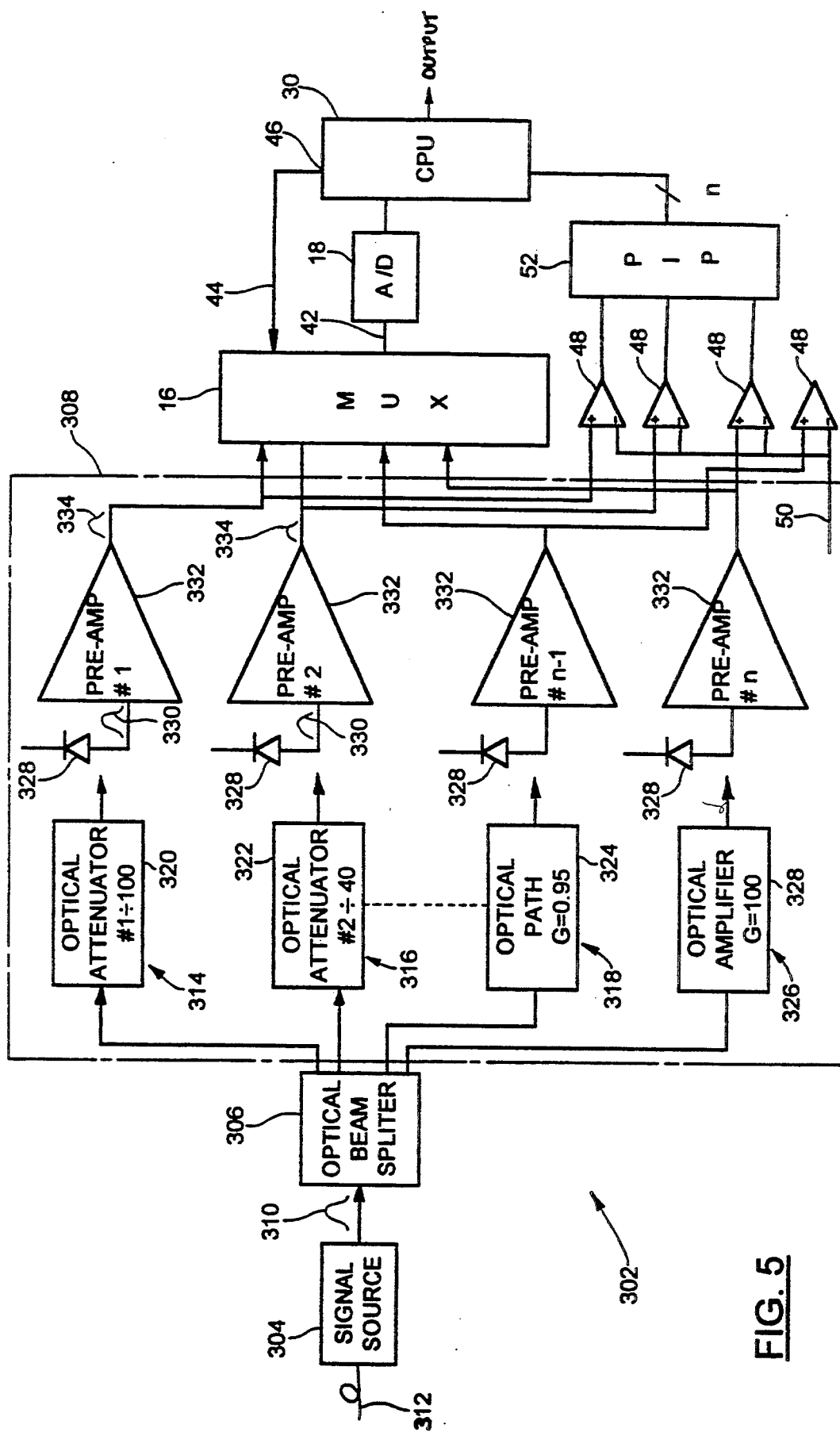
FIG. 5 shows in block diagram a second embodiment of a digitizer according to the present invention.

FIG. 5 shows a second embodiment of a digitizer 300 according to the present invention. For the digitizer 300 shown in FIG. 5, the scaling bank 14 (FIG. 1) has been replaced by an optical front-end indicated by reference 302. The optical front-end 302 comprises an optical signal source 304, an optical beam splitter 306, and an optical scaling bank 308. Instead of an analog signal 22, the optical signal source 304 provides an optical signal 310 which corresponds to the reflected and backscattered light received from a fiber optic cable 312 under test. It will be appreciated by one skilled in the art that in addition to improved noise immunity, the optical front-end 302 can operate faster than the electronic scaling bank 14 of FIG. 1. In FIG. 5, corresponding components from FIG. 1 are indicated by the same reference numbers.

The optical scaling bank 308 comprises N optical attenuation and amplifier channels. FIG. 5 shows three attenuation channels 314,316,318 each having respective optical attenuators 320,322,324 and a gain channel 326 having an optical amplifier 328.

The optical scaling bank 308 is coupled to the signal source 304 through the optical beam splitter 306. The beam splitter 306 distributes the optical signal 310 received from the fiber cable 312 to each of the N channels of the scaling bank 308. Each channel includes an optical transducer 328 (such as a PIN or APD photodetector) which converts the output of the optical attenuator 320 or optical amplifier 328 into an electric current signal 330. The current 330 feeds into a pre-amplifier amplifier 332, typically a trans-impedance amplifier, which converts the current signal 330 into a voltage signal 334.

The output of each pre-amplifier 332 provides an input to the analog multiplexer 16 and an input to the corresponding comparator 48. The optical channel having a signal covering the widest range of the A/D converter 18 (without saturating) is determined using the bank of comparators 48 as was discussed above. The non-saturating optical channel 314,316,318 or 320 is then routed through the multiplexer 16 to the A/D converter 18 for digitization.

Suitable devices for building the optical front-end 302 shown in FIG. 5, include the Ebrium-doped fiber optic amplifier and commercially available known optical fiber attenuators and beam splitters.

It will be evident to those skilled in the art that other embodiments of the present invention fall within its spirit and scope as defined by the following claims.

We claim:

1. A digitizer capable of digitizing an input signal with a large dynamic range, said digitizer comprising:
   (a) an input port for receiving the input signal;
   (b) a scaling bank for scaling the input signal, said scaling bank being coupled to the input port, and having a plurality of channels and each channel including an output and scaling means for producing at said output a scaled signal corresponding to the input signal;
   (c) a switch coupled to the outputs of said scaling bank and having a switch output and switching means for producing at the switch output one of said scaled signals;
   (d) an analog-to-digital converter having an analog input coupled to said switch output for receiving said scaled signal, and including a data output port and digitizing means for converting said scaled signal into a digital signal for output at said data output port; and
   (e) means for selecting one of said scaled signals having an input port coupled to the outputs of said channels in said scaling bank and an output port;
   (f) controller means coupled to said switch and to the output port of said means for selecting for controlling said switching means to select one of said scaled signals and said digitizing means for converting said scaled signal.

2. The digitizer claimed in claim 1, further including means for calibrating each of said channels in said scaling bank.

3. The digitizer claimed in claim 1, wherein said scaling means comprises amplifier means and attenuator means, said amplifier means and attenuator means including respective means for setting a gain factor for said channel and an attenuation coefficient for said channel.

4. The digitizer claimed in claim 1, wherein said switching means comprises a multiplexer, said multiplexer having a plurality of inputs, an output and input selector, each of said inputs being connected to one of said channels and said output being connected to the analog input of said analog-to-digital converter, and said input selector being coupled and responsive to said controller means.

5. The digitizer claimed in claim 1, wherein said input port comprises an optical beam splitter having an input for receiving the input signal in the form of an input optical signal and a plurality of outputs and including means for producing said input optical signal at said outputs.

6. The digitizer claimed in claim 5, wherein said scaling means comprises optical amplifier means for producing an amplified optical signal and optical attenuator means for producing an attenuated optical signal, said scaling means further including optical transducer means for converting said optical signal into an electrical signal.

7. The digitizer claimed in claim 6, wherein said optical transducer means comprises a photodetector coupled to an amplifier means.

8. The digitizer claimed in claim 6, wherein said switching means comprises a multiplexer, said multiplexer having a plurality of inputs, an output and input selector, each of said inputs being connected to one of said channels for receiving said electrical signal and said output being connected to the analog input of said analog-to-digital converter, and said input selector being coupled and responsive to said controller means.

9. The digitizer claimed in claim 8, wherein said analog-to-digital converter has a pre-determined resolution and wherein said means for selecting has means for determining which of said scaled signals are within said resolution.

10. The digitizer claimed in claim 9, wherein said means for selecting comprises a plurality of comparator means each coupled to the output of one of said channels and to said controller means and wherein said means for determining is responsive to said comparator means.

11. The digitizer claimed in claim 1, wherein said analog-to-digital converter has a pre-determined resolution and wherein said means for selecting has means for determining which of said scaled signals are within said resolution.

12. The digitizer claimed in claim 11, wherein said means for selecting comprises a plurality of comparator means each coupled to the output of one of said channels and to said controller means and wherein said means for determining is responsive to said comparator means.

13. A method for using an analog-to-digital converter having a fixed resolution to digitize an input signal with a dynamic range that is outside the fixed resolution of said converter, said method comprising the steps of:
   (a) scaling the input signal according to a scaling factor to move the input signal within the resolution of the converter;
   (b) digitizing the input signal through the converter to produce a data sample;
   (c) correcting the data sample by applying the scaling factor from step (a);
   (d) calibrating the scaling factor comprising generating a test signal, scaling said test signal according to a base scale factor, digitizing said base scaled test signal into a first data sample and storing said first data sample, scaling said test signal according to another scale factor, digitizing said scaled test signal into a second data sample and storing said second data sample, collecting a plurality of said first and second data samples and fitting said first and second data samples to produce a linear function which represents said scaling factor.

* * * * *